(12) United States Patent
Kitahara

(10) Patent No.: US 6,398,350 B2
(45) Date of Patent: Jun. 4, 2002

(54) PIEZOELECTRIC VIBRATOR UNIT, LIQUID JET HEAD, MANUFACTURING METHOD OF PIEZOELECTRIC VIBRATOR UNIT, AND MANUFACTURING METHOD OF LIQUID JET HEAD

(75) Inventor: Tsuyoshi Kitahara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/778,767

(22) Filed: Feb. 8, 2001

(30) Foreign Application Priority Data

Feb. 8, 2000 (JP) .......................................... 2000-030525

(51) Int. Cl.<sup>7</sup> ............................................... M41J 2/045
(52) U.S. Cl. ............................................ 347/70; 347/72
(58) Field of Search ............................... 347/68, 70, 71, 347/72; 310/366, 365

(56) References Cited

U.S. PATENT DOCUMENTS

| 5,446,485 | A | * | 8/1995 | Usui et al. ..................... 347/72 |
| 6,070,971 | A | * | 6/2000 | Usui et al. ..................... 347/70 |
| 6,273,558 | B1 | * | 8/2001 | Kitahara ....................... 347/72 |

\* cited by examiner

Primary Examiner—Anh T. N. Vo
(74) Attorney, Agent, or Firm—Sughrue Mion, PLLC

(57) ABSTRACT

A piezoelectric vibrator unit (4) provided with a plurality of piezoelectric vibrators each having internal electrodes (32, 33) and piezoelectric material layers (31) laminated alternately, a free end part of an outermost layer of a piezoelectric vibrator is trimmed to form a partial recess, thereby adjusting a natural vibration period of the piezoelectric vibrator.

26 Claims, 7 Drawing Sheets

PIEZOELECTRIC VIBRATOR UNIT, LIQUID JET HEAD, MANUFACTURING METHOD OF PIEZOELECTRIC VIBRATOR UNIT, AND MANUFACTURING METHOD OF LIQUID JET HEAD

BACKGROUND OF THE INVENTION

This invention relates to a liquid jet unit used in an industrial machine, such as a manufacturing machine, a stamping or marking apparatus and a microdispenser, and in an image recording apparatus such as a plotter and a printer. In more detail, this invention relates to a liquid jet device provided with a liquid jet head that can eject a liquid droplet from a nozzle opening, and a piezoelectric vibrator unit used in the liquid jet unit, and in particular, to the liquid jet device and the piezoelectric vibrator unit that are designed to make natural vibration periods of the piezoelectric vibrators uniform.

Industrial machines and image recording apparatuses are available, which employ a liquid jet head for ejecting liquid in the form of liquid droplets. For example, an industrial machine for manufacturing an optical filter is designed to eject color material in the form of liquid droplets onto a filter substrate using an ejection head (a kind of liquid jet head). A stamping or marking apparatus for ejecting color material in the form of liquid droplets from an ejection head onto a fiber product such as a fabric to print figures and patterns on the product, and a microdispenser for ejecting an extremely small amount of liquid from an ejection head to supply the liquid to a predetermined location are also known as the industrial machines. A printer and a plotter are known as the image recording apparatuses, which are designed to eject ink droplets from a recording head (a kind of liquid jet head) onto a printing or recording medium such as paper.

These industrial machines and image recorders require high accuracy for the amount and speed of the ejected liquid droplets. For example, the optical filter manufacturing machine must eject a proper amount (i.e. a proper ejection amount) of an color material droplet onto a proper position with high accuracy since the optical filter manufactured with the industrial machine is used with a liquid crystal display, etc. The image recording apparatus requires high accuracy as to a position onto which an ink droplet is ejected, and an amount of the ejected ink, in order to improve image quality and speed up the recording.

The liquid head used in these industrial machines and image recording apparatuses are designed, for example, such that by applying an electric field to a piezoelectric vibrator provided in the piezoelectric vibrator unit, the piezoelectric vibrator is displaced (expanded and contracted) using its vibration characteristic (natural vibration period) to cause pressure fluctuation in a pressure chamber communicating with a nozzle opening, thereby ejecting a liquid droplet from the nozzle opening.

The piezoelectric vibrator unit is manufactured, for example, according to the following procedure: First, common internal electrodes and segment internal electrodes are laminated alternately with a piezoelectric material interposed between adjacent internal electrodes to manufacture a plate-like laminated substrate, and a common external electrode electrically conducted to the common internal electrodes and a segment external electrodes electrically conducted to the segment internal electrodes are formed on the surface of the laminated substrate to obtain a laminated member. After the base end side portion of the laminated member is fixed to a fixing plate, the leading end side portion of the laminated member is cut into a plurality of segments (piezoelectric vibrators) each having an extremely narrow width of about 50 μm to 100 μm using a wire saw, a dicing saw, etc.

Since each of piezoelectric vibrators provided in the piezoelectric vibrator unit are obtained by the mechanical cutting to have an extremely narrow width as described above, slight variations may occur in the widths of the piezoelectric vibrators. The lengths of the free end parts of the piezoelectric vibrators (free lengths) may vary depending on the accuracy in joining the laminated member to the fixing plate. If the natural vibration periods of the piezoelectric vibrators are non-uniform due to these variations, a manufactured liquid jet head suffers from a problem in that the amount of the ejected droplet and the position where the droplet is ejected vary from one nozzle opening to another depending on the variations in the natural vibration periods of the piezoelectric vibrators.

However, hitherto, a method effective for adjusting the natural vibration periods of the piezoelectric vibrators after the laminated member is joined to the fixing plate and divided into the piezoelectric vibrators has been unavailable. Thus, to manufacture a liquid jet head that can eject uniform amounts of droplets from nozzle openings, a piezoelectric vibrator unit having piezoelectric vibrators whose natural vibration periods are uniform needs to be selected among a large number of manufactured piezoelectric vibrator units. This results in the lowering of the manufacturing yield.

SUMMARY OF THE INVENTION

It is therefore an object of the invention to provide a piezoelectric vibrator unit, a liquid jet head, a manufacturing method of the piezoelectric vibrator unit, and a manufacturing method of the liquid jet head, which can make uniform the natural vibration periods of piezoelectric vibrators with high accuracy.

To achieve the object, the present invention provides, as the first aspect thereof, a piezoelectric vibrator unit comprising a plurality of piezoelectric vibrators, each having at least in part, a laminate structure including first and second internal electrodes laminated alternately with a layer of piezoelectric material interposed between adjacent pairs of the first and second internal electrodes to define an active region in a free end part, a first external electrode electrically conducted to the first internal electrodes and a second external electrode electrically conducted to the second internal electrodes, wherein a potential difference is given to the piezoelectric material in the active region through the first and second external electrodes to activate the piezoelectric material, thereby displacing the free end part, wherein:

a partial mass adjusting portion including a partial recess and/or a partial projection is provided to an outer surface of the piezoelectric vibrator in the free endpart to adjust a natural vibration period of the piezoelectric vibrator.

The present invention provide, as a second aspect thereof, a piezoelectric vibrator unit, wherein the outer surface of the piezoelectric vibrator in the free end part is used as a trimming portion where the partial recess is formed by trimming. The second aspect can be effectively used in combination with the first aspect.

The present invention provides, as a third aspect, a piezoelectric vibrator unit, wherein an outermost layer of the piezoelectric material is thicker than another layer of the piezoelectric material. The third aspect can be effectively used in combination with the first or second aspect.

The present invention provide, as a fourth aspect, a piezoelectric vibrator unit, wherein a mass addition portion, formed of material higher in density than the piezoelectric material, is joined to a surface of an outermost layer of the piezoelectric material, and the mass addition portion is used as a trimming portion. The fourth aspect can be effectively used in combination with any one of the first to third aspects.

The present invention provides, as a fifth aspect, a piezoelectric vibrator unit, wherein another mass addition portion is joined to a surface of the piezoelectric vibrator opposite from the outer surface of the piezoelectric material. The fifth aspect can be effectively used in combination with the fourth aspect.

The present invention provides, as a sixth aspect, a piezoelectric vibrator unit, wherein the outer surface of the piezoelectric vibrator, other than surfaces of first and second external electrodes, is used as a trimming portion. The sixth aspect can be effectively used in combination with anyone of first to fifth aspects.

The present invention provides, as a seventh aspect, a piezoelectric vibrator unit, wherein the outer surface of the piezoelectric vibrator in the free end part is used as a mass point addition portion where the partial projection is formed by adding a mass point. The seventh aspect can be effectively used in combination with the first aspect.

The present invention provides, as an eighth aspect, a piezoelectric vibrator unit, wherein the mass point is formed by applying and solidifying fluidic mass point material including an adhesive, a wax and a solder. The eighth aspect can be effectively used in combination with the seventh aspect.

The present invention provides, as a ninth aspect, a piezoelectric vibrator unit, wherein the piezoelectric vibrators are manufactured by
  laminating piezoelectric material layers and internal electrode layers alternately to provide a laminate substrate; and
  at least partially cutting the laminate substrate to provide the piezoelectric vibrators in the form of teeth of comb.

The ninth aspect can be effectively used in combination with any one of the first to eight aspects.

The present invention provides, as a tenth aspect, a piezoelectric vibrator unit, wherein each of the piezoelectric vibrator is of a piezoelectric vibrator of such a longitudinal vibration lateral effect that the free end part is displaceable in a direction perpendicular to alamination direction. The tenth aspect can be effectively used in combination with any one of the first to ninth aspect.

The present invention provides, as an eleventh aspect, a piezoelectric vibrator, wherein each of the piezoelectric vibrator is of a piezoelectric vibrator of such a longitudinal vibration longitudinal effect that the free end part is displaceable in a lamination direction. The eleventh aspect can be effectively used in combination with any one of the first to ninth aspects.

The present invention provides, as a twelfth aspect, a piezoelectric vibrator, wherein each of the piezoelectric vibrators includes an inactive part which is not displaced even when the piezoelectric material in the active region is activated, and the inactive part is joined to a fixing plate. The twelfth aspect can be effectively used in combination with any one of the first to eleventh aspects.

The present invention provides, as a thirteenth aspect, a liquid jet head comprising:
  a piezoelectric vibrator unit; and
  a flow passage unit having an elastic plate forming a part of a sealing member for pressure chambers communicated with nozzle openings, wherein:
  the piezoelectric vibrator unit is attached to the flow passage unit so that leading end surface parts of the piezoelectric vibrators are joined to the elastic plate.

As the piezoelectric vibrator unit in the thirteenth aspect, the piezoelectric vibrator of any one of first to twelfth aspects can be effectively used.

The present invention provides, as a fourteenth aspect, a liquid jet head, further comprising:
  a case defining a storage space in which the piezoelectric vibrator unit can be stored;
  an adjustment opening formed through the case for communication between an outside of the case and the storage space to enable access to the piezoelectric vibrators stored in the storage space, wherein
  the partial mass adjusting portion can be provided to each of the piezoelectric vibrators from the outside of the case through the adjustment opening. The fourteenth aspect can be effectively used in combination with the thirteenth aspect.

The present invention provides, as a fifteenth aspect, a manufacturing method of manufacturing a piezoelectric vibrator unit comprising:
  a laminate member manufacturing step of laminating electrode layers forming common internal electrodes and segment internal electrodes alternately with piezoelectric material interposed between adjacent electrode layers to provide a laminate substrate defining an active region in a free end part, and subsequently forming a common external electrode and a segment external electrode on the laminate substrate to be electrically connected to the common internal electrodes and the segment internal electrodes, respectively, thereby providing a plate-like laminate member;
  a unit manufacturing step of joining a fixing end portion of the laminate member to a fixing plate;
  a vibrator manufacturing step of at least partially cutting the laminate member fixed to the fixing plate to provide comb-like piezoelectric vibrators; and
  an adjusting step of adjusting natural vibration periods of the piezoelectric vibrators to be uniform by trimming at least one of free end parts of outermost piezoelectric material layers, each forming an outermost layer of a corresponding piezoelectric vibrator in a lamination direction.

The present invention provides, as a sixteenth aspect a method, wherein, in the adjusting step, the free end parts of the outermost piezoelectric material layers are trimmed by at least one of a laser beam processing, a mechanical processing, and an electric discharge processing. The sixteenth aspect can be effectively used in combination with the fifteenth aspect.

The present invention provides, as a seventeenth aspect, a manufacturing method of manufacturing a piezoelectric vibrator unit comprising:
  a laminate member manufacturing step of laminating electrode layers forming common internal electrodes and segment internal electrodes alternately with piezoelectric material interposed between adjacent electrode layers to provide a laminate substrate defining an active region in a free end part, and subsequently forming a common external electrode and a segment external electrode on the laminate substrate to be electrically connected to the common internal electrodes and the segment internal electrodes, respectively, thereby providing a plate-like laminate member;
  a unit manufacturing step of joining a fixing end portion of the laminate member to a fixing plate;

a vibrator manufacturing step of at least partially cutting the laminate member fixed to the fixing plate to provide comb-like piezoelectric vibrators; and an adjusting step of adjusting natural vibration periods of the piezoelectric vibrators to be uniform by adding a mass point onto at least one of free end part surfaces of the piezoelectric vibrators thus provided.

The present invention provides, as an eighteenth aspect, a method, wherein, in the adjusting step, mass point material made of an adhesive, a wax or a solder is ejected onto the free end surface using an ejection device provided with a hot melt ink jet head, and the mass point material ejected onto the free end surface is solidified to provide the mass point. The eighteenth aspect can be effectively used in combination with the seventeenth aspect.

The present invention provides, as a nineteenth aspect, a method of manufacturing a liquid jet head comprising:

a piezoelectric vibrator unit including a plurality of piezoelectric vibrators, each having at least in part, a laminate structure including first and second internal electrodes laminated alternately with a layer of piezoelectric material interposed between adjacent pairs of the first and second internal electrodes to define an active region in a free end part, a first external electrode electrically conducted to the first internal electrodes and a second external electrode electrically conducted to the second internal electrodes, wherein a potential difference is given to the piezoelectric material in the active region through the first and second external electrodes to activate the piezoelectric material, thereby displacing the free end part, a flow passage unit having an elastic plate forming a part of a sealing member for pressure chambers communicated with nozzle openings;

a case defining a storage space in which the piezoelectric vibrator unit can be stored, and an adjustment opening formed through the case for communication between an outside of the case and the storage space to enable access to the piezoelectric vibrators stored in the storage space, wherein leading end surface parts of the piezoelectric vibrators are joined to the elastic plate, and the liquid jet head is adapted so that deformation of a piezoelectric vibrator causes deformation of a pressure chamber and varies pressure of liquid in the pressure chamber to thereby eject liquid from an associated nozzle opening, said method comprising:

a natural vibration period measuring step of measuring natural vibration periods of the piezoelectric vibrators one by one by applying adjusting drive signals to the piezoelectric vibrators in a state in which the leading end surface parts are joined to the elastic plate; and a vibration period adjusting step of setting a processing condition for each of the piezoelectric vibrators based on result of measurement by natural vibration period measuring step, and providing, based on the processing condition, a partial mass adjusting portion including a partial recess and/or a partial projection to an outer surface of a piezoelectric vibrator in the free end part using the adjustment opening to thereby adjust a natural vibration period of the piezoelectric vibrator.

The present disclosure relates to the subject matter contained in Japanese patent application No. 2000-30525 (filed on Feb. 8, 2000), which is expressly incorporated herein by reference in its entirety.

DESCRIPTION OF THE PREFERRED EMBODIMENT

Referring now to the accompanying drawings, preferred embodiments of the invention will be described. In the following description, an ink jet recording head mounted to an ink jet printer is discussed as an example of a liquid jet head. The present invention is applicable not only to a recording head of an image recording apparatus such as a plotter and a facsimile machine, but also to a liquid jet head of an industrial machine such as a manufacturing machine, a stamping or marking apparatus and a microdispenser.

Figure 1:
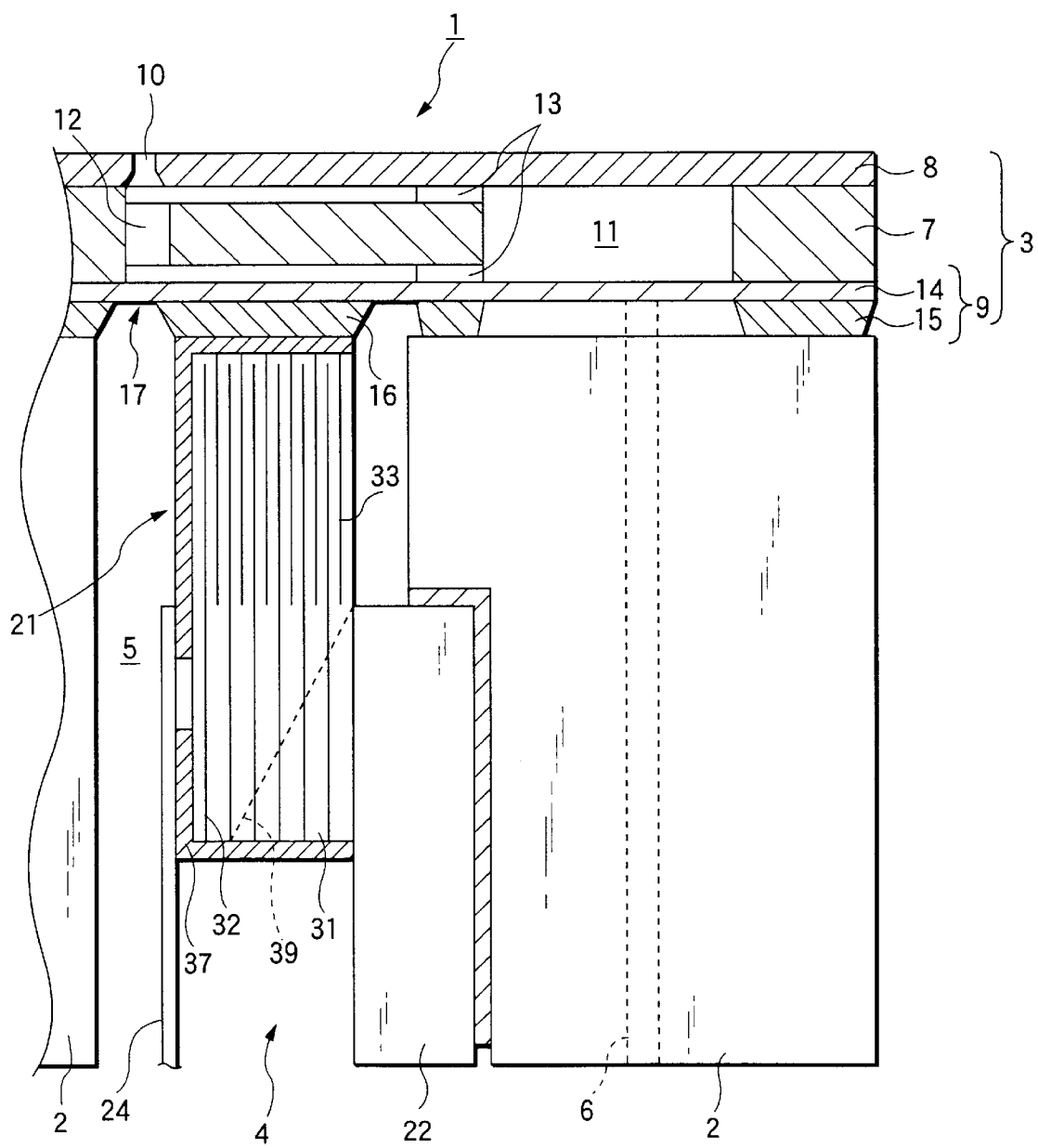
FIG. 1 is a sectional view to show the main part of a piezoelectric vibrator unit and an ink jet record head according to a first embodiment of the invention on an enlarged scale.

Referring to FIG. 1, an entire construction of a recording head 1 will be described. The recording head 1 includes a case 2, a flow passage unit 3, a piezoelectric vibrator unit 4, etc. For convenience in describing the recording head 1, the top of FIG. 1 is referred to as a leading end side (a front side) and the bottom of FIG. 1 is referred to as a base end side (a rear side).

The case 2 is a block-shaped member made of a synthetic resin, having a storage space 5, the leading end and the rear end of which are both open. The flow passage unit 3 is joined to the leading end surface of the case 2, and the piezoelectric vibrator unit 4 is fixedly housed in the storage space 5 in a state in which the leading ends of comb-shaped teeth of a vibrator group 21 is confronted with the leading end side opening of the storage space 5. An ink supply tube 6, which communicates with an ink cartridge on the base end side, is provided to a lateral side of the storage space 5.

The flow passage unit 3 is mainly made up of a flow passage formation plate 7, a nozzle plate 8, and an elastic plate (pressure plate) 9.

The nozzle plate 8 is a thin plate-like member provided with a large number of (for example, 96) nozzle openings 10 . . . arrayed in a row or rows at pitches corresponding to dot formation density. The nozzle plate 8 is formed, for example, by a stainless plate.

The flow passage formation plate 7 stacked or laminated on the nozzle plate 8 is formed with a reservoir 11 into which ink supplied through the ink supply tube 6 flows, pressure chambers 12 each for generating ink pressure required for ejecting ink from a corresponding one of the nozzle openings 10, and ink supply ports 12, 13 for communication of the reservoir 11 with the pressure chambers 12. In the embodiment, a silicon wafer is subjected to etching treatment to obtain the flow passage formation plate 7 having these components.

In the embodiment, the elastic plate 9 has such a double structure that a polymer film, such as PPS (polyphenylene sulfide), is laminated as an elastic film 14 on a support plate 15, such as a stainless plate. The support plate 15 are partially perforated by etching treatment so that a compliance part corresponding to the reservoir 11 and diaphragm parts 17 corresponding to the respective pressure chambers 12 are formed only by the elastic film 14. Each diaphragm part 17 is formed with an island part 16 by removing the support plate 15 annularly so as to leave the center portion. The island part 16 has a rear side to which the leading end surface part of a respective drive vibrator 29 described later is joined. A plurality of the island parts 16 are provided at pitches corresponding to the dot formation density similarly to the nozzle openings 10, and each of the island parts 16 is formed as a block having a narrow width corresponding to the nozzle array direction and a longer length corresponding to the laminated direction (described later) in the drive vibrator 29.

The flow passage unit 3 is manufactured by placing the nozzle plate 8 and elastic plate 9 on the front side and the rear side of the flow passage formation plate 7, respectively to interpose the flow passage formation plate 7 between the nozzle plate 8 and the elastic plate 9, and integrating them together by bonding, etc. The elastic plate 9 of the flow passage unit 3 forms a part of a seal member for sealing the ceiling surfaces of the pressure chambers 12 and the reservoir 11. Therefore, a set of ink flow passages (i.e. a set of liquid flow passages in a liquid ejection head) are defined within the flow passage unit 3, which correspond in number to the nozzle openings 10 and which respectively extend from the reservoir 11 through the pressure chambers 12 to the nozzle openings 10.

Figure 2:
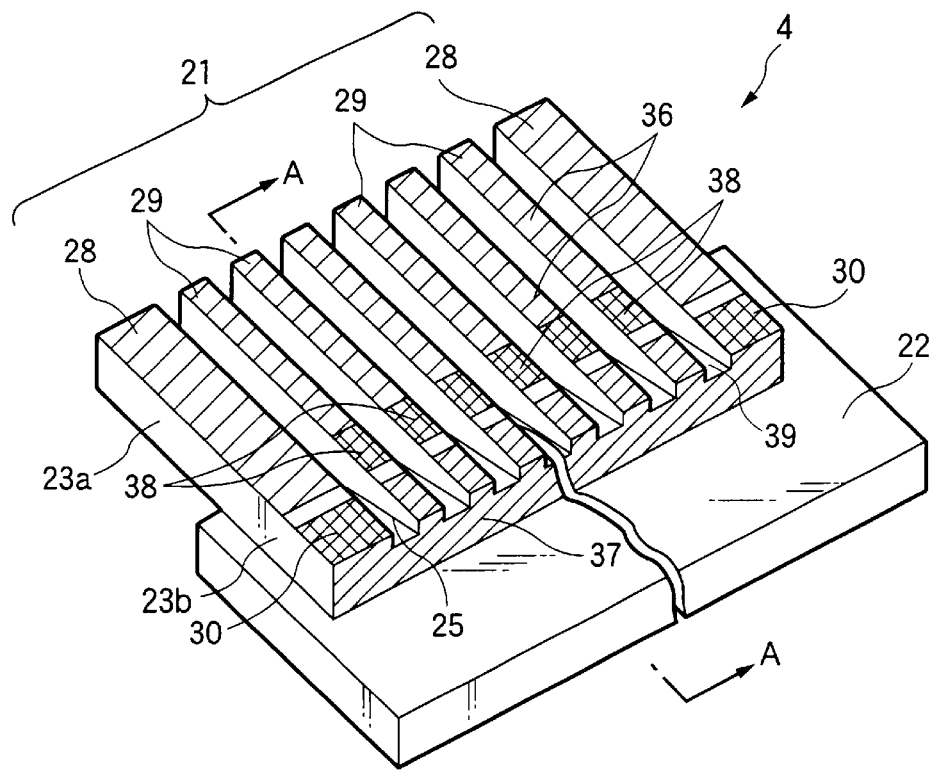
FIG. 2 is a perspective view of the appearance of the piezoelectric vibrator unit according to the first embodiment of the invention.
Figure 3:
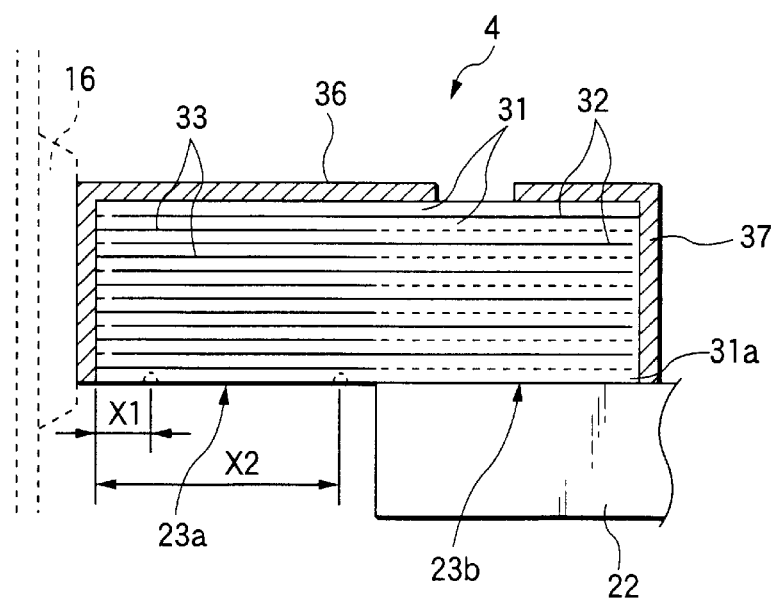
FIG. 3 is a sectional view take on line A-A in FIG. 2.

As shown in FIG. 2, the piezoelectric vibrator unit 4 is mainly made up of the vibrator group 21 and a fixing plate 22. The vibrator group 21 includes piezoelectric vibrators 28, 29 that are arrayed as a row like teeth of the comb shape. That is, the vibrator group 21 has a pair of dummy vibrators 28 and 28 located at both outermost ends in the row (in the array direction), and a plurality of drive vibrators 29 . . . disposed between the dummy vibrators 28 and 28. The drive vibrators 29 are piezoelectric vibrators associated with ink droplet ejection, and formed separately one from another into needles each having an extremely narrow width of about 50 μm to 100 μm, for example. The drive vibrators 29 . . . are provided to correspond in number to the pressure chambers 10 . . . The dummy vibrators 28 are piezoelectric vibrator not associated with the ink droplet ejection, each having a sufficiently wider width than the drive vibrator 29 so as to provide necessary rigidity. Each of the piezoelectric vibrators 28, 29 in the embodiment is a piezoelectric vibrator of so-called vertical vibration mode, and expanded and contracted in a direction orthogonal to the laminating direction of the piezoelectric members 31 and the internal electrodes 32, 33 as shown in FIG. 3.

Next, the drive vibrator 29 will be discussed with reference to FIG. 3.

The drive vibrator 29 is designed such that common internal electrodes 32 (corresponding to first internal electrodes of the invention) and segment internal electrodes 33 (corresponding to second internal electrodes of the invention) are laminated alternately with piezoelectric member of material (a layer of piezoelectric material) 31 interposed between the adjacent internal electrodes. The common internal electrodes 32 are electrodes for setting the same potential level for all drive vibrators 29. The segment internal electrodes 33 are electrodes, each for setting a potential level for a respective drive vibrator 29.

The portion of the drive vibrator 29 from the leading end thereof to about a half or two thirds in the vibrator length direction (direction orthogonal to the lamination direction) is a free end part 23a. The remaining portion of the drive vibrator 29, namely, the portion from the end of the free end part 23a to the vibrator base end is a base end part 23b.

The free end part 23a is formed with an active region where the common internal electrodes 32 and the segment internal electrodes 33 overlap each other (overlap portion). When a potential difference is given to the internal electrodes 32, 33, the piezoelectric material 31 in the active region is activated and deformed so that the free end part 23a is displaced (expanded or contracted) in the vibrator length direction.

The base ends of the common internal electrodes 32 are electrically conducted to a common external electrode 37 (corresponding to a first external electrode in the invention) at the base end surface part of the drive vibrator 29. On the other hand, the leading ends of the segment internal electrodes 33 are electrically conducted to a segment external electrode 36 (corresponding to a second external electrode in the invention) at the leading end surface part of the drive vibrator 29. The leading ends of the common internal electrodes 32 are positioned slightly behind the leading end surface part of the drive vibrator 29 so as not to be exposed from the leading end surface part of the drive vibrator 29. The base ends of the segment internal electrodes 33 are positioned at the boundary between the free end part 23a and the base end part 23b.

The segment external electrode 36 is an electrode formed on the leading end surface part of the drive vibrator 29 and a wiring connection surface (upper surface in FIG. 3) of the drive vibrator 29, i.e. one side surface in the lamination direction in the drive vibrator 29, for electrical connection of the segment internal electrodes 33 to a wiring pattern of a flexible cable 24 (corresponding to a wiring member in the invention) The portion of the segment external electrode 36 on the wiring connection surface side is formed continuously from the leading end surface part to reach a position of the base end part 23b of the vibrator.

The common external electrode 37 is an electrode formed on the base end surface part of the drive vibrator 29, and the wiring connection surface thereof for electrical connection of the common internal electrodes 32 to the wiring pattern of the flexible cable 32. The portion of the common external electrode 37 on the wiring connection surface is formed continuously from a position slightly behind the fixing plate (22) side end part of the segment external electrode 36 toward the base end surface part.

In the embodiment, piezoelectric material 31a, i.e. the outermost piezoelectric material layer in the invention (hereinafter referred to as the outermost piezoelectric material layer 31a), is used as a trimming portion. That is, a portion of the outermost piezoelectric material layer 31a, which is located at the free end part 23a and which is not formed with the external electrodes 36 and 37, is used as the trimming portion the material of which is to be partially removed as a consequence of forming a partial recess (a hole, a notch, a cutout or the like). Therefore, in the present invention, the trimming portion is a portion where a partial mass increase/decrease portion (a partial mass adjusting portion) including a partial recess and/or a partial projection is to be formed.

If the trimming portion is subjected to trimming such that a partial recess is formed on the leading end side of the free end part 23a of the outermost piezoelectric material layer 31a, for example, at the position distanced X1 from the leading end of the free end part 23a as shown in FIG. 3, the portion where displacement of the drive vibrator 29 is large becomes light in weight, and thus the natural vibration period becomes short. On the other hand, if the trimming portion is subjected to trimming such that a partial recess is formed on the base end side of the free end part 23a of the outermost piezoelectric material layer 31a, for example, at the position distanced X2 from the leading end of the free end part 23a (at the position ahead of the base end of the free end part 23a) as illustrated in FIG. 3, the rigidity of the drive vibrator 29 is reduced, and thus the natural vibration period becomes long.

Figure 4:
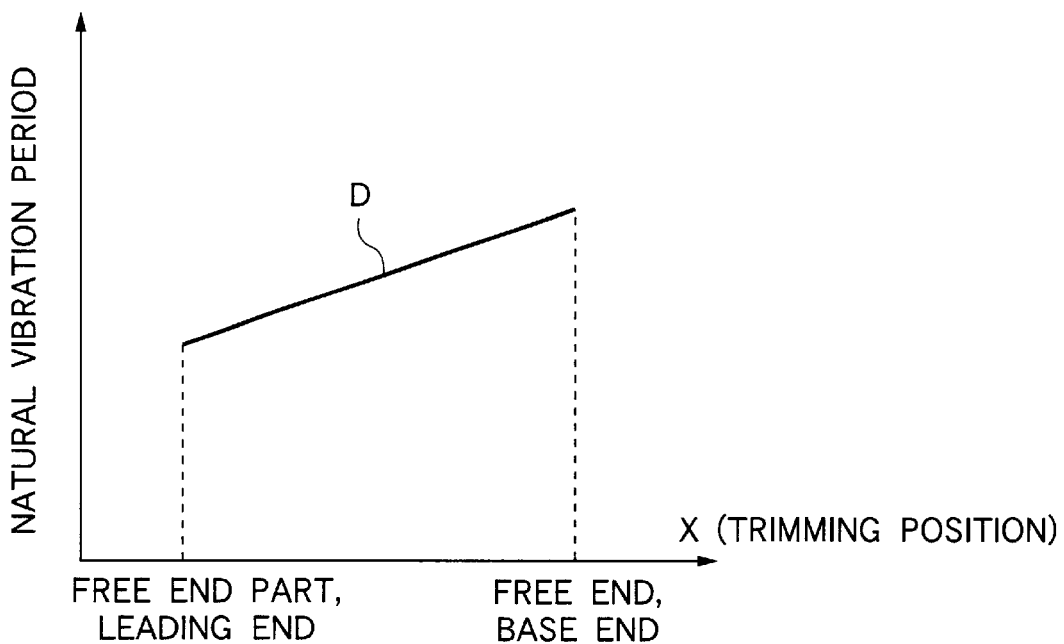
FIG. 4 is a drawing to show the relationship between the trimming positions and the natural vibration periods in the piezoelectric vibrator unit according to the first embodiment of the invention.

The natural vibration period of the drive vibrator 29 becomes shorter almost linearly as the trimming position on the outermost piezoelectric material layer 31a is changed from the base end side of the free end part 23a toward the leading end side thereof, as indicated by line D in FIG. 4. This means that the natural vibration period of the drive vibrator 29 can be adjusted depending on the trimming position of the outermost piezoelectric material layer 31a. The drive vibration period can also be finely adjusted by adjusting the depth and range of trimming. By trimming the trimming portion, variations in the natural vibration periods of the drive vibrators 29 can be adjusted to fall within a tolerable range, and the natural vibration periods can be made uniform.

Further, in the embodiment, the external electrodes 36 and 37 are not used as the trimming portion, and the outermost piezoelectric material layer 31a of the free end part 23a out of the external electrodes 36 and 37 is used as the trimming portion. Accordingly, the embodiment is free from a risk that the external electrode 36, 37 is inadvertently separated by the trimming to lose the activity of the piezoelectric material 31 facing the external electrode 36, 37.

The limit of removal by trimming in the depth direction (lamination direction) is set to be equal to the thickness of the outermost piezoelectric material layer 31a at most, namely, up to the range in which the segment internal electrode 33 disposed on the rear of the outermost piezoelectric material layer 31a is not damaged. This makes it impossible to impair the activity of the piezoelectric material layer 31 disposed in the rear side of the outermost piezoelectric material layer 31a.

In the present embodiment, the outermost piezoelectric material layer 31a has the same thickness as any other piezoelectric material layer 31, but the thickness of the outermost piezoelectric material layer 31a can be set as desired. Thus, the outermost piezoelectric material layer 31a may be set to be thicker than any other piezoelectric material layer 31.

If the outermost piezoelectric material layer 31a, namely, the trimming portion is thick, the trimming-possible amount is increased. Thus, the adjustment range of the natural vibration period is widened, and damage to the segment internal electrode 33 on the rear of the outermost piezoelectric material layer 31a can be suppressed. Consequently, even if the trimming portion is too much cut due to carelessness, the sufficiently thick trimming portion can protect the segment internal electrode 33 from being damage, and the manufacturing yield can be enhanced.

The invention is not limited to use of the outermost piezoelectric material layer 31a as the trimming portion. A separate member serving as a trimming portion may be provided to the outermost piezoelectric material layer 31a.

Figure 5:
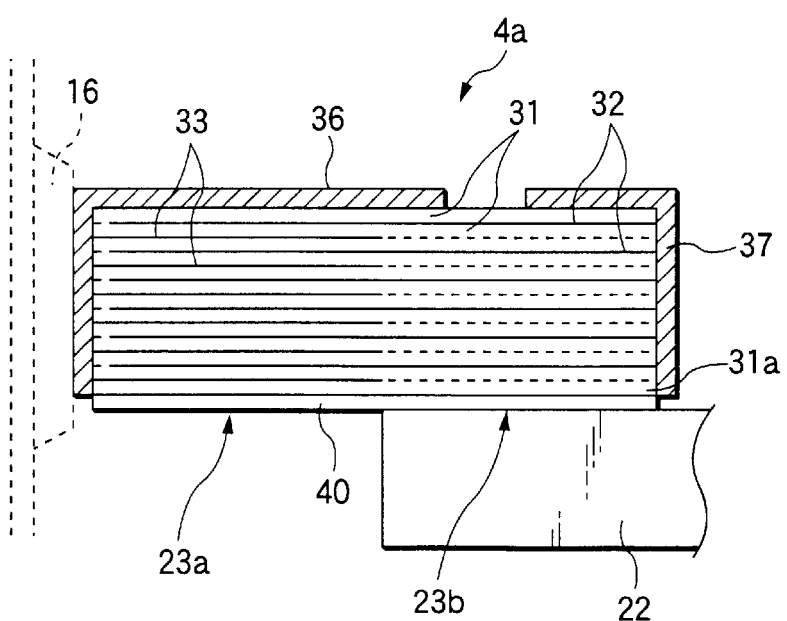
FIG. 5 is a sectional view of a first modified embodiment of the piezoelectric vibrator unit according to the first embodiment of the invention.

For example, in a first modified embodiment of piezoelectric vibrator unit 4a illustrated in FIG. 5, a mass addition member 40 formed of a material higher in density than the piezoelectric material 31 is joined to the surface of each outermost piezoelectric material layer 31a to form a trimming portion. That is, the mass addition members 40 are respectively provided onto the surfaces of the outermost piezoelectric material layers 31a of the drive vibrators 29. The mass addition member 40 is made of a metal material, such as stainless steel or tungsten.

In the modified embodiment, the mass addition member 40 joined to the outermost piezoelectric material layer 31a is used as the trimming portion, so that the trimming portion can be trimmed for adjusting and making uniform the natural vibration periods of the drive vibrators 29 . . . In this case, the outermost piezoelectric material layer 31a to which the mass addition member 40 is joined functions as an electrode damage prevention material for suppressing damage to the segment internal electrode 33 disposed on the rear of the outermost piezoelectric material layer 31a.

The two layers, i.e. the layer of the mass addition member 40 and the outermost piezoelectric material layer 31a laminated together may be used to function as the trimming portion. In this case, since the two layers, i.e. the layer of the mass addition member 40 and the outermost piezoelectric material layer 31a secure the thickness from the segment internal electrode 33 disposed on the rear of the outermost piezoelectric material layer 31a, the adjustment range can be enlarged and damage to the segment internal electrode 33 can also be suppressed.

The mass addition member 40 is not limited to that in the first modified embodiment. For example, as shown in FIGS. 6 and 7, the mass addition member 40 shorter in the vibrator length direction than that in the first modified embodiment may be provided.

Figure 6:
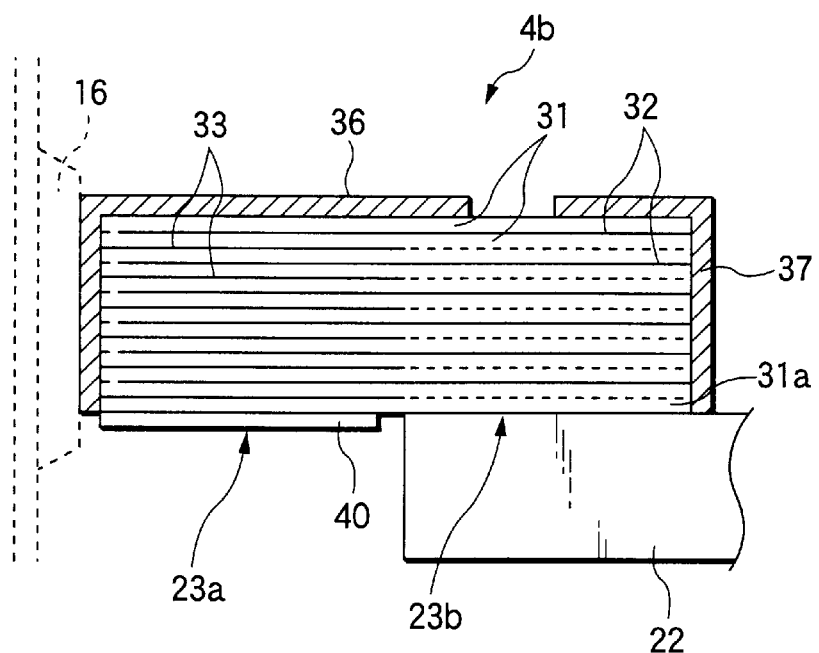
FIG. 6 is a sectional view of a second modified embodiment of the piezoelectric vibrator unit according to the first embodiment of the invention.

A piezoelectric vibrator unit 4b of a second modified embodiment illustrated in FIG. 6 includes the drive vibrators 29 each having the mass addition member 40 that is joined to the surface of outermost piezoelectric material layer 31a to be slightly spaced from the fixing plate 22 and to extend to the leading end of free end part 23a.

Figure 7:
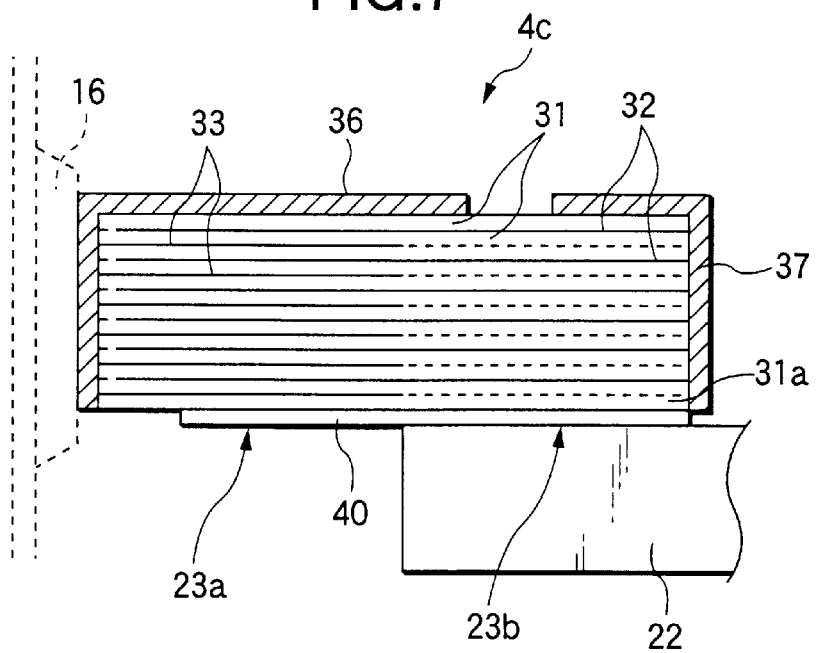
FIG. 7 is a sectional view of a third modified embodiment of the piezoelectric vibrator unit according to the first embodiment of the invention.

A piezoelectric vibrator unit 4c of a third modified embodiment illustrated in FIG. 7 includes the drive vibrators 29 each having the mass addition member 40 that is joined to the surface of outermost piezoelectric material layer 31a to extend from a position spaced at a predetermined distance from the leading end of free end part 23a to the base end of the drive vibrator 29.

The second and third modified embodiments differs from the first modified embodiment in illustrated in FIG. 5 only with respect to the location of the mass addition member 40, and can provide the advantages similar to those of the first modified embodiment.

In each of the modified embodiments described above, the mass addition member 40 is joined to one side of the drive vibrator 29 and thus a bending mode (deflection mode) may be excited due to the rigidity of the mass addition member during the expansion and contraction of the drive vibrator 29. However, since the leading end of the drive vibrator 29 is joined to the island part 16, the vibration mode for expanding and contracting in the vibrator length direction is hard to be affected.

However, if the excitation of the bending mode is suppressed, variations in the ink amount and speed of ejected ink droplets can be further suppressed. Therefore, the mass addition members 40 maybe respectively joined to the opposed surfaces of the drive vibrator 29 in the lamination direction for balancing the rigidity of the drive vibrator 29.

Figure 8:
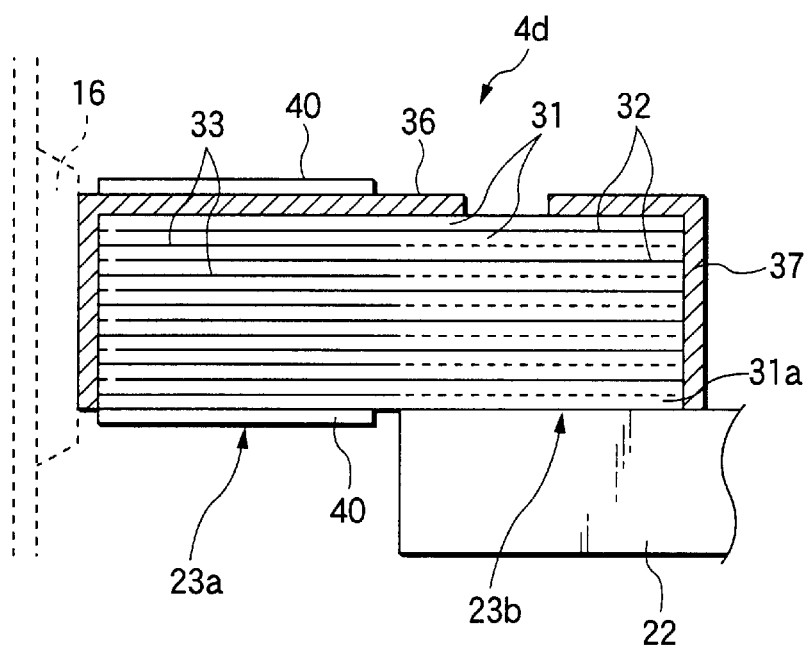
FIG. 8 is a sectional view of a fourth modified embodiment of the piezoelectric vibrator unit according to the first embodiment of the invention.

For example, as illustrated in FIG. 8, a piezoelectric vibrator unit 4d of a fourth modified embodiment includes the drive vibrators 29, each having the mass addition members 40 that are respectively joined to the surface of outermost piezoelectric material layer 31a and the surface of the segment external electrode 36 to correspond in location to each other and extend from a position slightly spaced at a predetermined distance from the base end of free end part 23a of drive vibrator 29 to the leading end of the free end part 23a. In other words, to correspond in location to the mass addition member 40 in the second embodiment illustrated in FIG. 6, an additional mass addition member 40 the same as the mass addition member 40 in the second modified embodiment is joined to the surface of the segment external electrode 36.

By joining the mass addition members 40 to the opposite surfaces of the drive vibrator 29 in the lamination direction correspondingly, the rigidity of the drive vibrator 29 can be balanced and excitation of the bending mode can be suppressed.

In each of the modified embodiments described above, the thickness of the mass addition member 40 can be changed as desired, and may be set to match the adjustment range to be prepared for the piezoelectric vibrator unit 4.

In the drive vibrator 29 thus constructed, the base end part 23b functions as an inactive part not expanded or contracted even when the piezoelectric material 31 in the active region is activated. In each of the embodiments, this inactive part is utilized as a wiring connection part and a fixing plate joint part.

That is, the flexible cable 24 is disposed on the wiring connection surface side of the base end part 23b, and the segment external electrode 36 and the common external electrode 37 are electrically connected to the flexible cable 24 on the base end part 23b. More specifically, connection end parts of the flexible cable 32 are placed on and connected to common electrode wiring parts 30 and segment electrode wiring parts 38 shown in FIG. 2. The flexible cable 24 is installed in place by soldering, etc. A drive signal is supplied through the flexible cable 24 to each electrode 32, 33, 36, 37. The fixing plate attachment surface of the base end part 23b functions as the fixing plate joint part onto which the fixing plate 22 is joined. In short, the drive vibrators 29 . . . are joined onto the fixing plate 22 in a so-called cantilever state.

The piezoelectric vibrator unit 4 as constructed above is mounted so that the leading end sides of the piezoelectric vibrators 28, 29 are directed toward the flow passage unit 3, and the leading end surface parts of the free end portions 23a of the drive vibrators 29 are contacted with and joined to the rear sides of the island parts 16 of the elastic plate 9, respectively, as shown in FIG. 1.

Therefore, when a drive pulse is supplied to the drive vibrator 29 to expand or contact the drive vibrator 29 in the vibrator length direction, the elastic membrane 14 forming the diaphragm part 17 becomes deformed in the back and forth direction. In association with the back and forth motion of the diaphragm part 17, the pressure chamber 12 is expanded or contracted to change the volume of the pressure chamber 12.

To eject an ink droplet from the nozzle opening 10, a drive signal is supplied selectively to the drive vibrator 29 associated with the ink droplet ejection so that, for example, the pressure chamber 12 is once expanded, then contracted. In doing so, as the pressure chamber 12 is expanded, ink in the reservoir 14 flows into the pressure chamber 12, and as the pressure chamber 12 is contracted, the ink pressure in the pressure chamber 12 is raised. Ink pushed out from the nozzle opening 10 is ejected as an ink droplet.

Next, a manufacturing method of the piezoelectric vibrator unit 4 will be discussed.

In this manufacturing method, first a plate-like laminate member is manufactured (laminate member manufacturing step). In this step, in the beginning, a plate-like laminate substrate is manufactured by laminating the common internal electrodes 32 and the segment internal electrodes 33 alternately with the piezoelectric material 31 interposed therebetween so that the common internal electrodes 32 and the segment internal electrodes. 33 overlap in the leading end side portion forming the free end part 23a and that a non-overlapping region where only the common internal electrodes 32 exist is formed in the base end side portion forming the base end part 23b.

If the laminate substrate is manufactured, a segment external electrode 31 is formed continuously on the leading end surface part of the laminate substrate and the range of the wiring connection surface from the leading end thereof to the top of the base end part 23b, and a common external electrode 37 is formed continuously on the base end surface part of the laminate substrate, and the range of the wiring connection surface from the base end thereof to the top of the base end part 23b, thereby manufacturing a laminate member with the external electrodes.

In the case where the piezoelectric vibrator unit 4 of each modified embodiment is to be manufactured, the laminate member manufacturing step further includes a mass addition member (40) joining step. That is, after the laminate member with the external electrodes is manufactured, the mass addition member 40 is additionally joined to a surface of each outermost piezoelectric material layer 31a where the external electrodes 36 and 37 are not formed, to thereby complete the manufacture of the laminate member. In addition, although the mass addition member (40) joining step in this example is executed after the laminate member with the external electrode is manufactured, the mass addition member (40) joining step may be executed after the laminate substrate is manufactured by laminating the internal electrodes 32 and 33 alternately with the piezoelectric material 31 interposed therebetween. Further, although the separate mass addition members (40) may be joined to the surface of the laminate substrate or the laminate member to correspond in location to the respective drive vibrators 29, it is preferable to join a plate or sheet forming the mass addition members 40 to the surface of the laminate substrate or the laminate member because the plate or sheet can also be divided into the mass addition members 40 by the vibrator manufacturing step described later.

After the laminate member with the external electrodes is manufactured, the laminate member is cut to provide a vibrator group 21 having a plurality of piezoelectric vibrators 28 and 29 arrayed in a row. First, a fixing plate 22 is joined to the fixing plate attachment surface of the base end part 23b of the laminate member by bonding or the like (a unit manufacturing step). After the fixing plate 22 is joined, a wire saw, a dicing saw, etc., is used to cut and divide the laminate member into teeth of the comb, i.e. into individual piezoelectric vibrators 28 and 29 in the form of elongated needles, as shown in FIG. 2 (a vibrator manufacturing step).

At this time, as shown in FIGS. 1 and 2,. a slant groove 39 is formed so that cutting lines for the laminate member on the fixing plate 22 side extends down to the leading end position of the fixing plate 22 and the cutting lines on the wiring connection surface side extends down to the base end surface part.

The reason why the plate-like laminate member is joined to the fixing plate 22 before it is divided into teeth of comb is to stably divide the laminate member and facilitate handling during subsequent processing. Therefore, if the laminate member can be stably divided into teeth of comb, the laminate member may be joined to the fixing plate 22 after it is divided into teeth of comb.

In the piezoelectric vibrator unit 4 thus manufactured, since each drive vibrator 29 has an extremely narrow width of about 50 $\mu$m to 100 $\mu$m, and the mechanical processing method is adopted, the widths of the drive vibrators 29 may be varied. Further, the lengths of the free end portions 23a of the piezoelectric vibrators may be varied depending on the accuracy with which the piezoelectric vibrators are joined to the fixing plate 22. For these reasons, there is a possibility that the natural vibration periods of the drive vibrators 24 formed like comb teeth may be non-uniform from one drive vibrator 29 to another.

Then, in the embodiment, after the plate-like laminate member is separated to manufacture the piezoelectric vibrator 28, 29, the natural vibration periods of the drive vibrators 29 are made uniform according to the above-described technique (adjustment step). In the adjustment step, a laser beam is applied to the trimming portion of the drive vibrator 29 requiring adjustment to partially remove the trimming portion for making uniform the natural vibration periods of the drive vibrators 29. Thus, the natural vibration periods of the vibrators can be made the same, as a whole.

The adjustment step will be discussed with reference to a flowchart of FIG. 9.

In the adjustment step, first the natural vibration period of each drive vibrator 29 is measured (S1). For example, the natural vibration period of the drive vibrator 29 is measured using a laser Doppler vibration meter and an oscilloscope. The difference between the measured natural vibration period of the drive vibrator 29 and a target value is calculated (S2), and the trimming position and depth of the trimming portion are calculated based on the difference (S3). To execute this calculation, for example, a data table indicating the relationship between the trimming positions and the natural vibration periods as shown in the graph of FIG. 4 can be provided in memory of a microcomputer forming a controller and can be used.

If the trimming position and depth are calculated, a laser beam is used to trim, namely, remove a part of the trimming portion (S4), and upon completion of the adjustment for the drive vibrator 29, another drive vibrator 29 is adjusted. A check process of measuring the natural vibration period of the trimmed drive vibrator 29 after a part of the trimming portion is trimmed and determining whether or not the natural vibration period after the adjustment falls within the allowable range of the target value may be provided. If it is determined in the check process that the natural vibration period is not within the allowable range, again the above-described steps (S1 to S4) can be repeated for enhancing the adjustment accuracy.

Laser beam processing capable of easily executing trimming with high accuracy is used as the trimming method, but the invention is not limited to it, and any other known mechanical processing method or electric discharge processing method can also be used. Particularly, since the mass addition member 40 is trimmed in the modified embodiments described above, plasma processing less accurate than the laser beam processing can be used as the trimming method to adjust the natural vibration period without damaging the segment internal electrode 33. That is, the selection range of the trimming devices can be widened.

The above-described manufacturing method has the advantage that each trimming portion is adjusted at the final stage of the manufacturing process of the piezoelectric vibrator unit 4, whereby the natural vibration periods of the drive vibrators 29 can be made uniform. Thus, even the piezoelectric vibrator unit 4 which had to be handled as a defective formerly can be mounted on a product by adjustment, and the manufacturing yield can also be raised.

Since variations in the natural vibration periods of the drive vibrators can be suppressed, the ink droplet ejection characteristics of the nozzle openings 10, such as the ink droplet amount and speed, can be made uniform with good accuracy, so that the image quality can be enhanced.

Further, since the drive vibration periods are adjusted at the final stage of the manufacturing process, the possibility that the drive vibration period of each drive vibrator 29 will change after the adjustment is low. Therefore, needless steps of re-adjustment, etc., may be skipped and manufacturing can be made efficient.

In the first embodiment, the trimming portion of the drive vibrator 29 is trimmed, namely, a partial recess is formed to decrease the mass and the trimming position is adjusted, thereby adjusting the natural vibration period. However, the adjustment of the natural vibration period may be realized by adding a mass point 41 as a partial projection to the drive vibrator 29 to increase the mass and adjusting the location of the partial projection.

Figure 10:
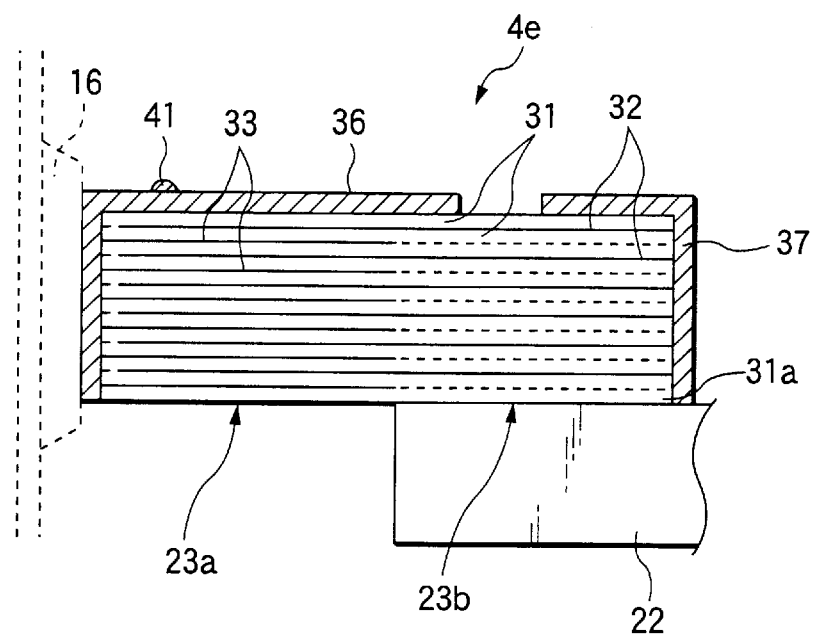
FIG. 10 is a sectional view of a piezoelectric vibrator unit according to a second embodiment of the invention.

For example, in a piezoelectric vibrator unit 4e of a second embodiment illustrated in FIG. 10, the surface of a free end part 23a of a drive vibrator 29 in a lamination direction is used as a mass point addition portion to which a mass point 41 is added. Specifically, the mass point addition portion ranges from the leading end of the free end part 23a to the base end thereof, and is formed on the surface of an outermost piezoelectric material layer 31a and the surface of a segment external electrode 36. The mass point addition portion may be formed on only one of the surfaces of the outermost piezoelectric material layer 31a and the segment external electrode 36.

The mass point 41 is added to the mass point addition portion for adjusting the natural vibration period of the corresponding drive vibrator 29. The mass point 41 is provided by hardening a reasonably massive liquid material such as an adhesive or wax with which metal particles are mixed, or a solder, which will be hereinafter referred to as mass point material, on the surface of the free end part 23a. The mass point 41 has adhesion for preventing the mass point from being detached after being added.

The piezoelectric vibrator unit 4e is manufactured as follows: First, the common internal electrodes 32 and the segment internal electrodes 33 are laminated alternately with the piezoelectric material 31 interposed therebetween so as to leave non-overlap region of only the common internal electrodes 32, thereby manufacturing a laminate substrate. Next, a segment external electrode 36 is formed continuously in the leading end surface portion of the laminate substrate and in the range of the wiring connection surface from the leading end in the wiring to a position above the base end part 23b, and a common external electrode 37 is formed continuously in the base end surface part of the laminate substrate and in the range of the wiring connection surface from the base end to a position above the base end part 23b.

If the external electrodes 36 and 37 are formed, a fixing plate 22 is joined to the fix plate attachment surface of the base end part 23b in the laminate substrate, the laminate substrate is divided to have a comb shape having teeth, then an adjustment step is executed to make uniform the natural vibration periods of drive vibrators 29 in the form of teeth of comb is executed.

In the adjustment step, for example, using an ejection device having a hot melt ink jet head (simply, referred to as an ejection device), a mass point material is ejected to a mass point addition portion, and the mass point material ejected on the mass point addition portion is hardened to add a mass point 41, whereby the natural vibration periods of the drive vibrators 29 are made uniform. Thus, the natural vibration periods of the drive vibrators 29 can be made the same, as a whole.

Figure 9:
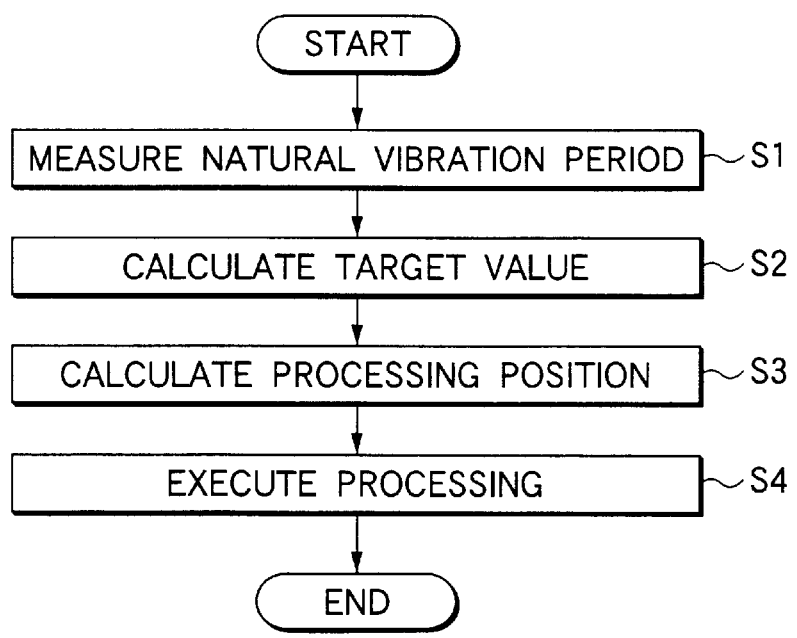
FIG. 9 is a flowchart to show an example of an adjustment step in a manufacturing method of the invention.

The specific procedure of adjusting the natural vibration period is similar to that for trimming illustrated in FIG. 9 except that the mass point addition position of each mass point addition portion and the addition amount are calculated, based on a data table indicating the relationship between the mass point addition positions and the natural vibration periods, from the difference between the measured natural vibration period of the drive vibrator 29 and a target value, and the mass point is added by the ejection device based on the calculation values for adjusting the natural vibration period.

In the second embodiment, the mass point 41 is added, namely, a mass is added partially to the free end part 23a, so that the natural vibration period can be adjusted so that it is prolonged. Therefore, to adjust the natural vibration period, the longest natural vibration period of the drive vibrators 29 is used as the target value to make uniform the natural vibration periods of all the drive vibrators 29.

In the first and second embodiments, the piezoelectric vibrator units 4 of vertical vibration lateral effect, in which each piezoelectric vibrator is expanded and contracted in the direction orthogonal to the lamination direction of the piezoelectric material 31, have been described. However, as illustrated in FIG. 11, the invention can also be applied to a piezoelectric vibrator unit 4f of vertical vibration vertical effect, in which each piezoelectric vibrator is deformed in the direction along the lamination direction of piezoelectric material 31.

Figure 11:
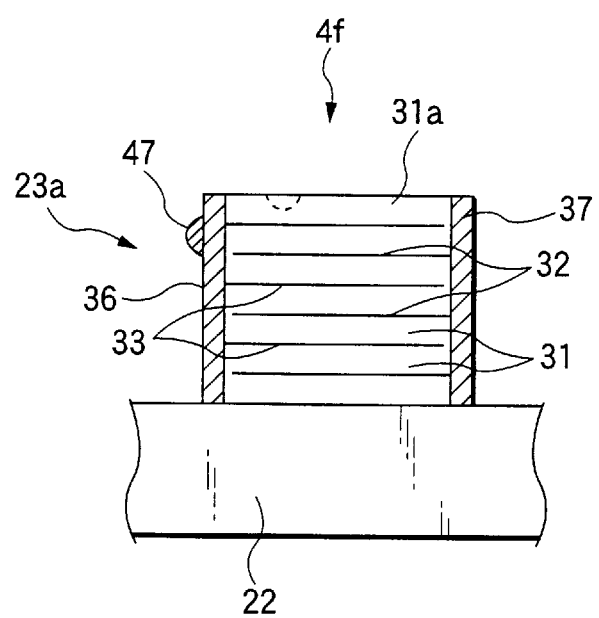
FIG. 11 is a sectional view of a piezoelectric vibrator unit according to a third embodiment of the invention.

To form the piezoelectric vibrator unit 4f of a third embodiment illustrated in FIG. 11, common internal electrodes 32 and segment internal electrodes 33 are laminated alternately with piezoelectric material 31 interposed between adjacent internal electrodes so that an active region is formed in each drive vibrator 29, and a common external electrode 37 electrically conducted to the common internal electrodes 32 is formed on one side of the laminate substrate, and a segment external electrode 36 electrically conducted to the segment internal electrodes 33 is formed on an opposite side of the laminate substrate. Each of the drive vibrators 29 has an outmost piezoelectric material layer 31a (the outermost layer of the piezoelectric material 31), the leading end of which is joined to the elastic plate 9 forming a part of the associated pressure generation chamber 12. A potential difference is given to the internal electrodes 32 and 33 of the drive vibrator 29 so that the drive vibrator 29 is displaced in the lamination direction (up and down direction in FIG. 11) to operate the elastic plate 9, to thereby operate the associated pressure chamber 12 for ejecting an ink droplet.

To adjust the natural vibration period of the drive vibrator 29, the outmost piezoelectric material layer 31a, i.e. the outermost layer in the lamination direction, is used as a trimming portion, and the trimming portion is trimmed. The surfaces of the segment external electrode 36 and the common external electrode 37, i.e. the surfaces of the free end part 23a, may be used as mass point addition portions to adjust the natural vibration period by adding at least one mass point 41 to one or both of the mass point addition portions. A mass addition material 40 may be joined to the surface of the outmost piezoelectric material layer 31a for use as a trimming portion.

In the embodiments described above, to adjust the natural vibration period of the drive vibrator 29, trimming of the trimming portion and addition of the mass point 41 to the mass point addition portion are executed separately. However, the adjustment method of the invention should not be restricted thereto or therby. For example, the drive vibrator 29 may be formed with a trimming portion and a mass point addition portion so as to be capable of being subjected to both trimming of the trimming portion and addition of the mass point 41 to the mass point addition portion to adjust the natural vibration period of the drive vibrator 29.

A mass point 41 may be added to the trimming portion or the trimming of the trimming portion and the addition of a mass point 41 to the trimming portion may be executed in combination, thereby adjusting the natural vibration period of the drive vibrator 29. In short, the natural vibration period of the drive vibrator can be adjusted by forming a partial mass increase/decrease portion made of a partial recess or projection.

The combination of the trimming and the addition of the mass point 41 as described above can widen the adjustment range of the drive vibrator 29.

In the embodiments described above, the adjustment for the natural vibration periods of the drive vibrators 29 . . . are applied to the piezoelectric vibrator unit 4 per se, but the adjustment for the natural vibration periods of the drive vibrators 29 . . . can be applied to the piezoelectric vibrator unit 4 assembled in a record head 1. A fourth embodiment adopting this method will be discussed.

Figure 12:
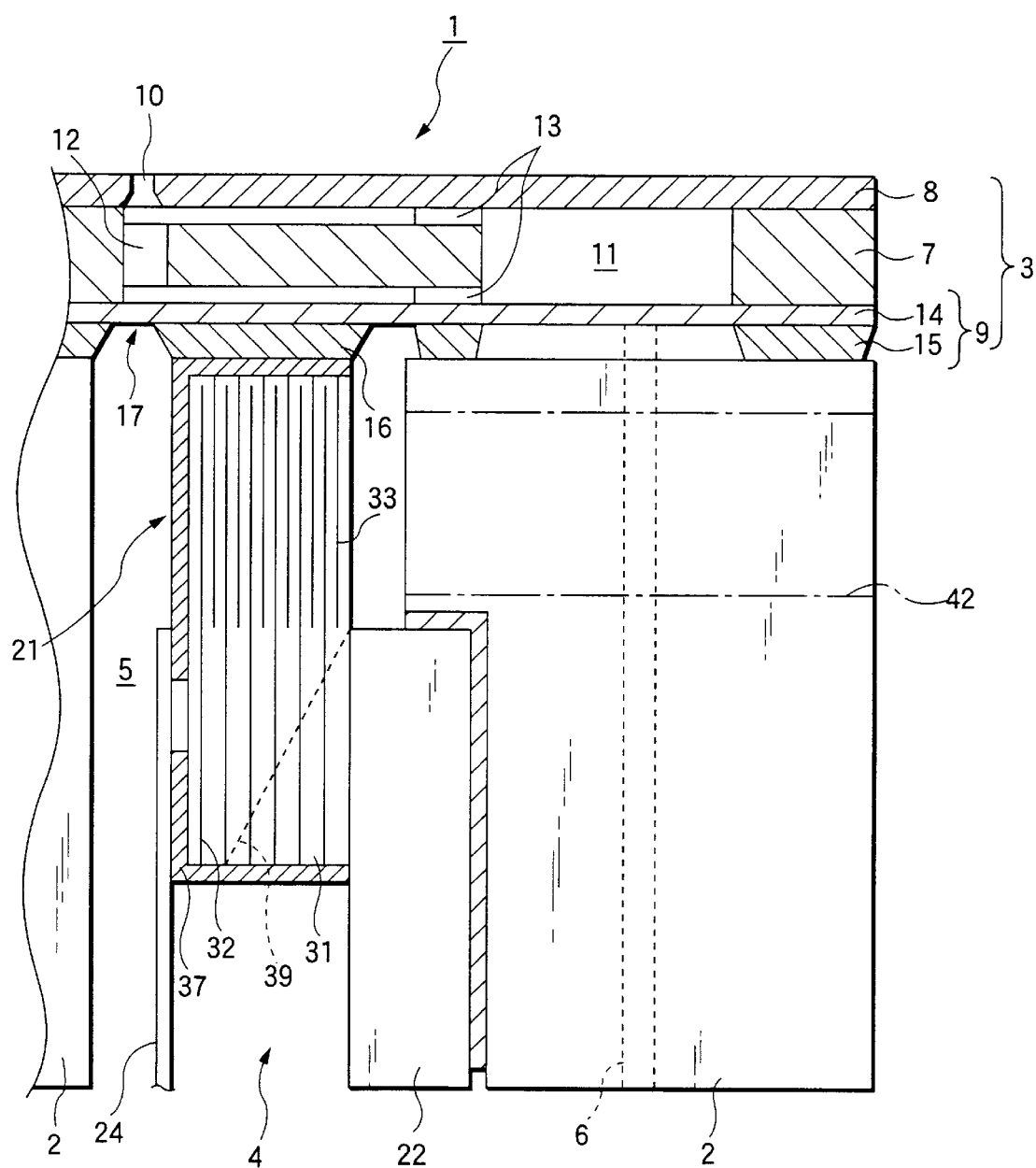
FIG. 12 is a sectional view of the main part of a record according to a fourth embodiment of the invention.

In the fourth embodiment, an adjustment opening 42 for communicating the outside of a case 2 with a storage space 5 is formed in the case 2, as indicated by the one-dotted chain line in FIG. 12. This adjustment opening 42 is provided for access to the drive vibrators 29 . . . during the adjustment of the natural vibration periods of drive vibrators 29 . . . , and enables the formation of the partial mass increase/decrease portions from the outside of the case 2. The adjustment opening 42 is confronted with the free end part of each of the drive vibrators 29 . . . attached to the inside of the case 2.

Therefore, each trimming portion can be trimmed or a mass point 41 can be added to each mass point addition portion through the adjustment opening 42 to thereby form the partial mass increase/decrease portions and adjust the natural vibration periods of the drive vibrators 29 . . . of the piezoelectric vibrator unit 4 built in the record head 1.

In the fourth embodiment, the record head 1 is manufactured according to the following procedure: First, a piezoelectric vibrator unit 4 is manufactured. Briefly, common internal electrodes 32 and segment internal electrodes 33 are laminated alternately with piezoelectric material 31 interposed between adjacent internal electrodes so as to form an active region in a free end part 23a, thereby manufacturing a plate-like laminate substrate. A segment external electrode 36 and a common external electrode 37 are formed on the surface of the laminate substrate for manufacturing a laminate member with the external electrodes. If the laminate member is manufactured, a fixing plate 22 is joined to the fixing plate attachment surface of the laminate member, and the laminate member is divided into teeth of comb, i.e. a plurality of piezoelectric vibrators 28 and 29.

If the piezoelectric vibrator unit 4 is manufactured, a flow passage unit 3 and a case 2 separately manufactured are joined to each other, and the piezoelectric vibrator unit 4 is housed in the interior of the joint body, namely, in a storage space 5. If the piezoelectric vibrator unit 4 is housed in the storage space 5, the natural vibration periods of the drive vibrators 29 . . . are adjusted. This adjustment includes a natural vibration period measuring step and a vibration period adjustment step.

The natural vibration period measuring step is a step of measuring the natural vibration period of each drive vibrator 29 joined to an island part 16 by applying an adjustment drive signal to each drive vibrators 29 . . . To measure the natural vibration periods, for example, a laser Doppler vibration meter and an oscilloscope are used as in the above-described embodiments.

The vibration period adjustment step is a step of making uniform the natural vibration periods of the drive vibrators 29.

That is, the treatment condition for each drive vibrator 29 is set based on the measurement result at the natural vibration period measuring step, and a partial mass increase/decrease portion is formed on the surface of the free end part of the corresponding drive vibrator 29 based on the setup treatment condition. That is, a partial recess is formed by trimming and/or a partial projection is formed by adding a mass point 41 appropriately from the outside of the case 2 through the adjustment opening 42.

In the adjustment method, the natural vibration periods of the drive vibrators 29 are adjusted in a state in which the piezoelectric vibrator unit 4 is built in the record head 1. Accordingly, it is also possible to simultaneously adjust the variations caused by factors other than the drive vibrators 29. For example, variations caused due to the factors including the joint state of each drive vibrator 29 and the island part 16 can be adjusted simultaneously. Since the natural vibration periods are adjusted at the final stage of the manufacturing process of the record head 1, there is no need to execute re-adjustment, etc., and manufacturing can be made efficient.

In the above-described embodiments, the ink jet record head 1 used in an image recorder has been taken as an example of a liquid jet head, but the scope of the invention is not limited to the record head 1. For example, the invention can also be applied to jet heads for industrial machines such as an optical filter manufacturing apparatus, a stamping or marking apparatus, and a microdispenser. The liquid jet heads, each of which uses high-durability piezoelectric vibrators, can be used stably over a long term.

To make uniform the drive vibrators of the piezoelectric vibrator unit, the present invention can be put into practice not only in the manners described above but also in any other manners including the following examples.

a) A partial recess and a partial projection may be both formed on one drive vibrator.

b) A plurality of partial recesses and a plurality of partial projections may be formed on one drive vibrator.

c) A partial recess may be formed on one drive vibrator, and a partial projection may be formed on another drive vibrator.

d) All of the drive vibrators may be formed with respective partial recesses and/or partial protrusions, but this is not essential. That is, it is sufficient that drive vibrators, the natural vibration periods of which are required to be adjusted, are formed respectively with the partial recesses and/or partial projections.

As described above, according to the invention, the following advantages are provided:

A partial mass increase/decrease portion including a partial recess and/or projection is formed on the surface of the free end part on the outermost layer of a piezoelectric vibrator so as to adjust the natural vibration period of said piezoelectric vibrator. Accordingly, the natural vibration period of said piezoelectric vibrator can be made identical to that of any other piezoelectric vibrator. Therefore, the ejection characteristics of droplets ejected through the nozzle openings can be made uniform.

Since the natural vibration periods can be adjusted, even the piezoelectric vibrator unit which had to be handled as a defective formerly can be mounted to a product by adjustment, and the manufacturing yield can also be raised.

Since the natural vibration periods are adjusted after the laminate member is divided into the vibrators, the possibility that the natural vibration period of each piezoelectric vibrator will change after the adjustment is low. Thus, there is no need to execute re-adjustment, etc., and manufacturing can be made efficient.

What is claimed is:

1. A piezoelectric vibrator unit comprising a plurality of piezoelectric vibrators, each having at least in part, a laminate structure including first and second internal electrodes laminated alternately with a layer of piezoelectric material interposed between adjacent pairs of the first and second internal electrodes to define an active region in a free end part, a first external electrode electrically conducted to the first internal electrodes and a second external electrode electrically conducted to the second internal electrodes, wherein a potential difference is given to the piezoelectric material in the active region through the first and second external electrodes to activate the piezoelectric material, thereby displacing the free end part, wherein:

a partial mass adjusting portion including a partial recess and/or a partial projection is provided to an outer surface of the piezoelectric vibrator in the free end part.

2. The piezoelectric vibrator unit of claim 1, wherein the outer surface of the piezoelectric vibrator in the free end part is used as a trimming portion where the partial recess is formed by trimming.

3. The piezoelectric vibrator unit of claim 1, wherein an outermost layer of the piezoelectric material is thicker than another layer of the piezoelectric material.

4. The piezoelectric vibrator unit of claim 1, wherein a mass addition portion, formed of material higher in density than the piezoelectric material, is joined to a surface of an outermost layer of the piezoelectric material, and the mass addition portion is used as a trimming portion.

5. The piezoelectric vibrator unit of claim 4, wherein another mass addition portion is joined to a surface of the piezoelectric vibrator opposite from the outer surface of the piezoelectric material.

6. The piezoelectric vibrator unit of claim 1, wherein the outer surface of the piezoelectric vibrator, other than surfaces of first and second external electrodes, is used as a trimming portion.

7. The piezoelectric vibrator unit of claim 1, wherein the outer surface of the piezoelectric vibrator in the free end part is used as a mass point addition portion where the partial projection is formed by adding a mass point.

8. The piezoelectric vibrator unit of claim 7, wherein the mass point is formed by applying and solidifying fluidic mass point material including an adhesive, a wax and a solder.

9. The piezoelectric vibrator unit of claim 1, wherein the piezoelectric vibrators are manufactured by laminating piezoelectric material layers and internal electrode layers alternately to provide a laminate substrate; and at least partially cutting the laminate substrate to provide the piezoelectric vibrators in the form of teeth of comb.

10. The piezoelectric vibrator unit of claim 1, wherein each of the piezoelectric vibrator is of a piezoelectric vibrator of such a longitudinal vibration lateral effect that the free end part is displaceable in a direction perpendicular to a lamination direction.

11. The piezoelectric vibrator of claim 1, wherein each of the piezoelectric vibrator is of a piezoelectric vibrator of such a longitudinal vibration longitudinal effect that the free end part is displaceable in a lamination direction.

12. The piezoelectric vibrator of claim 1, wherein each of the piezoelectric vibrators includes an inactive part which is not displaced even when the piezoelectric material in the active region is activated, and the inactive part is joined to a fixing plate.

13. A liquid jet head comprising:

the piezoelectric vibrator unit of claim 1; and a flow passage unit having an elastic plate forming a part of a sealing member for pressure chambers communicated with nozzle openings, wherein:

the piezoelectric vibrator unit is attached to the flow passage unit so that leading end surface parts of the piezoelectric vibrators are joined to the elastic plate.

14. The liquid jet head of claim 13, further comprising:

a case defining a storage space in which the piezoelectric vibrator unit can be stored;

an adjustment opening formed through the case for communication between an outside of the case and the storage space to enable access to the piezoelectric vibrators stored in the storage space, wherein the partial mass adjusting portion can be provided to each of the piezoelectric vibrators from the outside of the case through the adjustment opening.

15. A manufacturing method of manufacturing a piezoelectric vibrator unit comprising:

a laminate member manufacturing step of laminating electrode layers forming common internal electrodes and segment internal electrodes alternately with piezoelectric material interposed between adjacent electrode layers to provide a laminate substrate defining an active region in a free end part, and subsequently forming a common external electrode and a segment external electrode on the laminate substrate to be electrically connected to the common internal electrodes and the segment internal electrodes, respectively, thereby providing a plate-like laminate member;

a unit manufacturing step of joining a fixing end portion of the laminate member to a fixing plate;

a vibrator manufacturing step of at least partially cutting the laminate member fixed to the fixing plate to provide comb-like piezoelectric vibrators; and an adjusting step of providing a partial recess and/or a partial projection to at least one of free end parts of outermost piezoelectric material layers, each forming an outermost layer of a corresponding piezoelectric vibrator in a lamination direction.

16. The method of claim 15, wherein, in the adjusting step, the partial recess is provided by trimming the at least one of the free end parts.

17. The method of claim 16, wherein, in the adjusting step, the at least one of the free end parts is trimmed by at least one of a laser beam processing, a mechanical processing, and an electric discharge processing.

18. The method of claim 15, wherein, in the adjusting step, the partial projection is provided by adding a mass point onto the at least one of the free end parts.

19. The method of claim 18, wherein, in the adjusting step, mass point material made of an adhesive, a wax or a solder is ejected onto the at least one of the free end parts, and solidified to provide the mass point.

20. A method of manufacturing a liquid jet head comprising:

a piezoelectric vibrator unit including a plurality of piezoelectric vibrators, each having at least in part, a laminate structure including first and second internal electrodes laminated alternately with a layer of piezoelectric material interposed between adjacent pairs of the first and second internal electrodes to define an active region in a free end part, a first external electrode electrically conducted to the first internal electrodes and a second external electrode electrically conducted to the second internal electrodes, wherein a potential difference is given to the piezoelectric material in the active region through the first and second external electrodes to activate the piezoelectric material, thereby displacing the free end part, a flow passage unit having an elastic plate forming a part of a sealing member for pressure chambers communicated with nozzle openings;

a case defining a storage space in which the piezoelectric vibrator unit can be stored, and an adjustment opening formed through the case for communication between an outside of the case and the storage space to enable access to the piezoelectric vibrators stored in the storage space, wherein leading end surface parts of the piezoelectric vibrators are joined to the elastic plate, and the liquid jet head is adapted so that deformation of a piezoelectric vibrator causes deformation of a pressure chamber and varies pressure of liquid in the pressure chamber to thereby eject liquid from an associated nozzle opening, said method comprising:

a natural vibration period measuring step of measuring natural vibration periods of the piezoelectric vibrators one by one by applying adjusting drive signals to the piezoelectric vibrators in a state in which the leading end surface parts are joined to the elastic plate; and a vibration period adjusting step of setting a processing condition for each of the piezoelectric vibrators based on result of measurement by natural vibration period measuring step, and providing, based on the processing condition, a partial mass adjusting portion including a partial recess and/or a partial projection to an outer surface of a piezoelectric vibrator in the free end part using the adjustment opening to thereby adjust a natural vibration period of the piezoelectric vibrator.

21. A piezoelectric vibrator unit comprising a plurality of drive vibrators, each having at least in part, a laminate structure including first and second internal electrodes laminated alternately with a layer of piezoelectric material interposed between adjacent pairs of the first and second internal electrodes to form an active region, a first external electrode electrically conducted to the first internal electrodes and a second external electrode electrically conducted to the second internal electrodes, wherein:

at least one of the drive vibrators has a recess and/or projection that is located in the active region and provided to an outer surface of the drive vibrator.

22. The piezoelectric vibrator unit of claim 21, wherein the outer surface where the recess and/or projection is located is defined by an outermost piezoelectric material layer.

23. The piezoelectric vibrator unit of claim 21, wherein the outer surface where the recess and/or projection is located is defined by a member attached to an outermost piezoelectric material layer and made of material different from the piezoelectric material.

24. The piezoelectric vibrator unit of claim 21, wherein the outer surface where the projection is located is defined by one of first and second external electrodes.

25. The piezoelectric vibrator unit of claim 21, wherein the outer surface where the recess and/or projection is located extends in a direction parallel to a direction in which the first and second internal electrodes are laminated.

26. The piezoelectric vibrator unit of claim 21, wherein the outer surface where the recess and/or projection is located extends in a direction perpendicular to a direction in which the first and second internal electrodes are laminated.

* * * * *